United States Patent
Liu

(10) Patent No.: US 10,535,310 B2
(45) Date of Patent: Jan. 14, 2020

(54) GATE DRIVING UNIT AND GATE DRIVING CIRCUIT

(71) Applicant: Shenzhen China Star Optoelectronics Technology Co., Ltd., Shenzhen, Guangdong (CN)

(72) Inventor: Xujun Liu, Guangdong (CN)

(73) Assignee: SHENZHEN CHINA STAR OPTOELECTRONICS TECHNOLOGY CO., LTD., Shenzhen (CN)

(*) Notice: Subject to any disclaimer, the term of this patent is extended or adjusted under 35 U.S.C. 154(b) by 90 days.

(21) Appl. No.: 15/328,941

(22) PCT Filed: Jan. 5, 2017

(86) PCT No.: PCT/CN2017/070217
§ 371 (c)(1),
(2) Date: Oct. 26, 2017

(87) PCT Pub. No.: WO2018/040462
PCT Pub. Date: Mar. 8, 2018

(65) Prior Publication Data
US 2018/0336835 A1    Nov. 22, 2018

(30) Foreign Application Priority Data
Aug. 31, 2016    (CN) .......................... 2016 1 0797064

(51) Int. Cl.
*G09G 3/34*    (2006.01)
*H01L 33/00*    (2010.01)

(52) U.S. Cl.
CPC ............... *G09G 3/34* (2013.01); *H01L 33/00* (2013.01)

(58) Field of Classification Search
CPC ............ G09G 3/34; G09G 3/36; G09G 3/367; G09G 3/3674; G09G 3/3677;
(Continued)

(56) References Cited

U.S. PATENT DOCUMENTS 9,343,032 B2 *   5/2016  Dai .................... G09G 3/3677
9,483,992 B2 *  11/2016  Xiao ................... G09G 3/3677
(Continued)

FOREIGN PATENT DOCUMENTS

CN    1912965    2/2007
CN    103559867    2/2014
(Continued)

OTHER PUBLICATIONS

International Search Report and Written Opinion for International Application No. PCT/CN2017/070217, dated Apr. 27, 2017.
(Continued)

*Primary Examiner* — Jason Crawford

(57) ABSTRACT

Disclosed is a gate driving unit and a driving circuit, the gate driving unit comprising a pull-up control unit for generating a scanning control signal; a pull-up cascade transmission unit for converting a scanning clock signal into a line scanning signal; a pull-down unit for pulling down the scanning control signal and the line scanning signal to a low level; and a pull-down maintaining unit for maintaining the scanning control signal and the line scanning signal at the low level. The gate driving unit increases the reliability of the gate driving circuit.

10 Claims, 4 Drawing Sheets

(58) Field of Classification Search
CPC ....... G09G 2300/04; G09G 2300/0404; G09G 2300/0408
See application file for complete search history.

(56) References Cited

U.S. PATENT DOCUMENTS

| | | | |
|---|---|---|---|
| 2015/0029082 A1 | 1/2015 | Jeon et al. | |
| 2016/0140928 A1* | 5/2016 | Xiao | G09G 3/3648 345/212 |
| 2016/0148589 A1* | 5/2016 | Cao | G09G 3/3677 345/208 |
| 2016/0171949 A1* | 6/2016 | Dai | G09G 3/3677 |
| 2016/0189652 A1* | 6/2016 | Xiao | G09G 3/3677 327/109 |
| 2016/0260405 A1* | 9/2016 | Dai | G09G 3/3677 |
| 2016/0275895 A1* | 9/2016 | Dai | G09G 3/36 |
| 2016/0284303 A1* | 9/2016 | Dai | G09G 3/36 |
| 2016/0284304 A1* | 9/2016 | Dai | G09G 3/36 |
| 2016/0343332 A1* | 11/2016 | Cao | G09G 3/3677 |
| 2017/0193943 A1* | 7/2017 | Cao | H01L 27/124 |
| 2018/0190223 A1* | 7/2018 | Zeng | G09G 3/3648 |
| 2018/0226035 A1* | 8/2018 | Wang | G09G 3/3648 |

FOREIGN PATENT DOCUMENTS

| | | |
|---|---|---|
| CN | 103928007 | 7/2014 |
| CN | 104050941 | 9/2014 |
| CN | 106157916 | 11/2016 |

OTHER PUBLICATIONS

Chinese Office Action and Search Report for Chinese Patent Application No. 201610797064.8, dated Jul. 31, 2017.

* cited by examiner

GATE DRIVING UNIT AND GATE DRIVING CIRCUIT

CROSS-REFERENCE TO RELATED APPLICATIONS

The present application claims the priority of Chinese patent application CN 201610797064.8, entitled "Gate driving unit and gate driving circuit" and filed on Aug. 31, 2016, the entirety of which is incorporated herein by reference.

FIELD OF THE INVENTION

The present disclosure relates to the field of liquid crystal display, and in particular, to a gate driving unit and a gate driving circuit.

BACKGROUND OF THE INVENTION

Generally, a conventional driving circuit for a liquid crystal display device is in a form of an external integrated circuit module, such as the commonly used Tape Automated Bonding (TAB) packaging structure. With the development of a thin film transistor semiconductor process, the popularization of a narrow frame technique and the demands for reduced costs, integrated circuit technology based on the peripherals of an LCD TV panel becomes a focus of research, wherein a typical application is the Gate Driver on Array (GOA).

Using an array liquid crystal display device manufacturing procedure, the GOA driving circuit provides a gate scanning driving signal circuit on an array substrate to conduct drive scan line by line on pixel units. The GOA driving circuit not only enables to cut down the welding process of an external integrated circuit to improve the integration, but also boosts the production capacity and lowers the cost, and thus has become a trend in recent years. Further, with the popularization of the narrow frame technique, large-size liquid crystal display devices also need relevant technology support, and thus more requirements are made on the driving circuit.

Because a GOA driving unit for operating a line of pixels remains on for merely several tens of microseconds in one frame time but remains off for a fairly longer time, a pull-down maintaining unit remains in a prolonged on-state, which demands a high stability. In the prior art, an overall product reliability is generally enhanced by means of an increased channel length of key transistors in the pull-down maintaining unit, since as the channel length of the transistors increases, the time of a high-temperature and high-humidity test for the GOA circuit increases. For transistors having different channel lengths, however, the problem of uneven films would emerge when photomasks having a same penetration are used for exposure, while the cost would rise when photomasks having different penetrations are used.

The present disclosure provides an improved technical solution to the above mentioned problem so as to increase the circuit reliability.

SUMMARY OF THE INVENTION

One of the technical problems to be solved by the present disclosure is the need for a GOA driving circuit having a higher reliability.

In order to solve the above mentioned technical problem, in an embodiment of the present disclosure, a gate driving unit is first provided, comprising: a pull-up control unit configured to receive a line scanning signal of a previous-level gate driving unit and generate a scanning control signal for controlling operation of a pull-up cascade transmission unit; the pull-up cascade transmission unit connected with the pull-up control unit and configured to convert a scanning clock signal into the line scanning signal in accordance with the received scanning control signal; a pull-down unit connected with the pull-up control unit and the pull-up cascade transmission unit and configured to pull down the scanning control signal and the line scanning signal to a low level; and a pull-down maintaining unit connected with the pull-up control unit and the pull-up cascade transmission unit and configured to maintain the scanning control signal and the line scanning signal at the low level during a line scanning period of pixel units that are not located in a current line.

Preferably, the pull-down maintaining unit comprises a first pull-down maintaining unit and a second pull-down maintaining unit connected to each other via a source and a drain of a bridging transistor, wherein the first pull-down maintaining unit comprises a first pull-down transistor, a second pull-down transistor, a third pull-down transistor, and a fourth pull-down transistor for maintaining the low levels of the line scanning signal and the scanning control signal, respectively; the first pull-down transistor has a drain connected with the line scanning signal and a source connected in series with a drain of the second pull-down transistor; the third pull-down transistor has a drain connected with the scanning control signal and a source connected in series with a drain of the fourth pull-down transistor; sources of the second and fourth pull-down transistors are both coupled to a direct current (DC) pull-down voltage; gates of all the pull-down transistors are coupled jointly to a source or drain of the bridging transistor; and the second pull-down maintaining unit has such a circuit structure as to mirror the first pull-down maintaining unit.

Preferably, the pull-down maintaining unit comprises a first pull-down maintaining unit and a second pull-down maintaining unit connected via the source and the drain of the bridging transistor, wherein the first pull-down maintaining unit comprises a first pull-down transistor, a second pull-down transistor, and a third pull-down transistor for maintaining low levels of the line scanning signal and the scanning control signal, respectively; the first pull-down transistor has a drain connected with the line scanning signal and a source connected in series with a drain of the second pull-down transistor; the third pull-down transistor has a drain connected with the scanning control signal and a source coupled to a source-drain concatenation point between the first pull-down transistor and the second pull-down transistor; gates of all the pull-down transistors are coupled jointly to the source or drain of the bridging transistor; and the second pull-down maintaining unit has such a circuit structure as to mirror the first pull-down maintaining unit.

Preferably, the pull-down maintaining unit further comprises a first alternate control unit and a second alternate control unit connected to each other via the source and the drain of the bridging transistor, wherein the first alternate control unit comprises a fifth transistor having a gate and a drain coupled to each other to receive a first alternate control signal; a sixth transistor having a gate and a drain coupled to a source and the drain of the fifth transistor, respectively; a seventh transistor having a drain and a source coupled to the drain and the source of the sixth transistor respectively, and a gate configured to receive a second alternate control signal; and an eighth transistor having a drain coupled to the gate of the sixth transistor, a gate coupled to the gate of the bridging transistor, and a source connected to a DC pull-down voltage; and the second alternate control unit has such a circuit structure as to mirror the first alternate control unit, and input ends of a first alternate control signal and a second alternate control signal thereof are interchanged; and the first alternate control signal and the second alternate control signal are alternately in a high level and the low level.

Preferably, the alternate control signal has a frequency smaller than that of the scanning clock signal of the gate driving unit.

Preferably, the pull-down unit comprises a ninth pull-down transistor and a pull-down tenth transistor, wherein the ninth pull-down transistor and the tenth pull-down transistor have respective drains connected with the line scanning signal and the scanning control signal, sources connected with the DC pull-down voltage, and gates connected jointly with the line scanning signal of a next-level gate driving unit.

Preferably, the gate of the ninth pull-down transistor is connected with the line scanning signal of a next-level gate driving unit, and the gate of the tenth pull-down transistor is connected with the line scanning signal of a further next-level gate driving unit.

Preferably, the pull-up cascade transmission unit comprises: a pull-up transistor having a gate connected with the scanning control signal, a drain connected with the scanning clock signal, and a source which generates and outputs the line scanning signal; and a bootstrap capacitor having two ends connected in parallel with the gate and the source of the pull-up transistor to boost the scanning control signal when outputting the line scanning signal to ensure reliable output of the pull-up transistor.

Preferably, the pull-up control unit comprises a pull-up control transistor having a gate and a drain coupled to each other to receive the line scanning signal of a previous-level gate driving unit and generate and output the scanning control signal when the line scanning signal is at the high level.

In an embodiment of the present disclosure, a gate driving circuit is further provided, comprising multiple cascaded gate driving units of any one of claims 1-9. The respective gate driving units are sequentially driven by using four scanning clock signals of equal frequencies, wherein each scanning clock signal contains ¼ cycle of high level and ¾ cycle of low level, and the scanning clock signal of a next-level gate driving unit is delayed by ¼ cycle as compared with the scanning clock signal of a previous-level gate driving unit.

Compared with the prior art, one or more embodiments of the above solution has the following advantages or benefits.

The signal pull-down maintaining achieved by using mirrored pull-down maintaining circuit structures and two transistors connected in series indirectly lessens electric leakage of the pull-down maintaining unit and enhances reliability of the gate driving circuit.

Other advantages, purposes, and features of the present disclosure will be further explained in the following description, and partly become self-evident therefrom, or be understood through implementation of the present disclosure. The objectives and other advantages of the present disclosure will be achieved and obtained through the structure specifically pointed out in the description, claims, and the accompanying drawings.

BRIEF DESCRIPTION OF THE DRAWINGS

The drawings are provided for further understanding of the present disclosure, and constitute one part of the description. They serve to explain the present disclosure in conjunction with the embodiments, rather than to limit the present disclosure in any manner. In the drawings.

DETAILED DESCRIPTION OF THE EMBODIMENTS

The present disclosure will be further explained in conjunction with the drawings and embodiments, whereby the process of applying the technical means to solve the technical problem and to achieve corresponding technical effect can be sufficiently understood and implemented. Embodiments and all the features in the embodiments of the present disclosure can be combined if there is no conflict therebetween, and the technical solutions to be formed shall all fall into the scope of the present disclosure.

Figure 1:
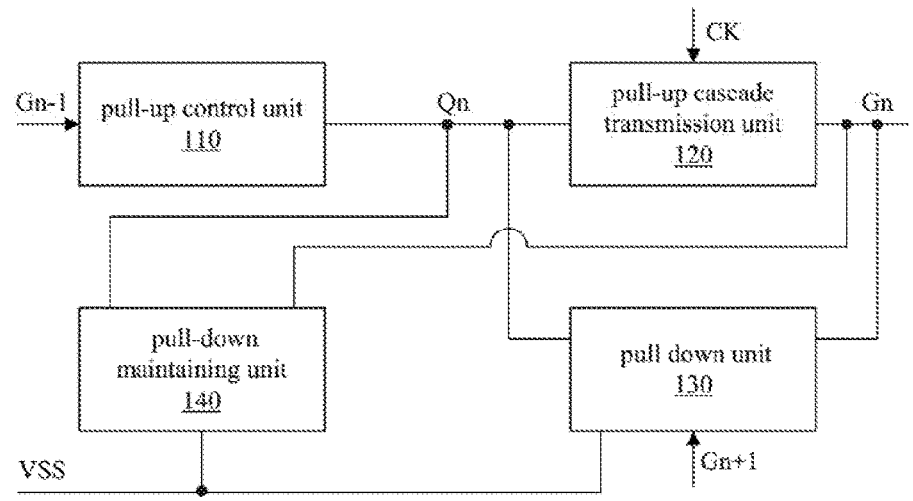
FIG. 1 is a structural diagram of a gate driving unit according to an embodiment of the present disclosure.

FIG. 1 is a structural diagram of a gate driving unit according to an embodiment of the present disclosure. As shown in the figure, a main structure of the gate driving unit comprises a pull-up control unit 110, a pull-up cascade transmission unit 120, a pull-down unit 130, and a pull-down maintaining unit 140. The pull-up control unit 110 receives a line scanning signal of a previous-level gate driving unit and generates a scanning control signal Qn for controlling operation of the pull-up cascade transmission unit 120. The pull-up cascade transmission unit 120 is connected with the pull-up control unit 110, to convert a scanning clock signal CK into the line scanning signal Gn according to the received scanning control signal Qn. The pull-down unit 130 is connected with the pull-up control unit 110 and the pull-up cascade transmission unit 120 respectively to pull down the scanning control signal Qn and line scanning signal Gn to a low level at a first time. The pull-down maintaining unit 140 is connected to the pull-up control unit 110 and the pull-up cascade transmission unit 120 respectively to maintain the scanning control signal Qn and the line scanning signal Gn at the low level during a line scanning period of pixel units that are not located in a current line. The above structures will be described in detail in connection with specific embodiments below.

Figure 2:
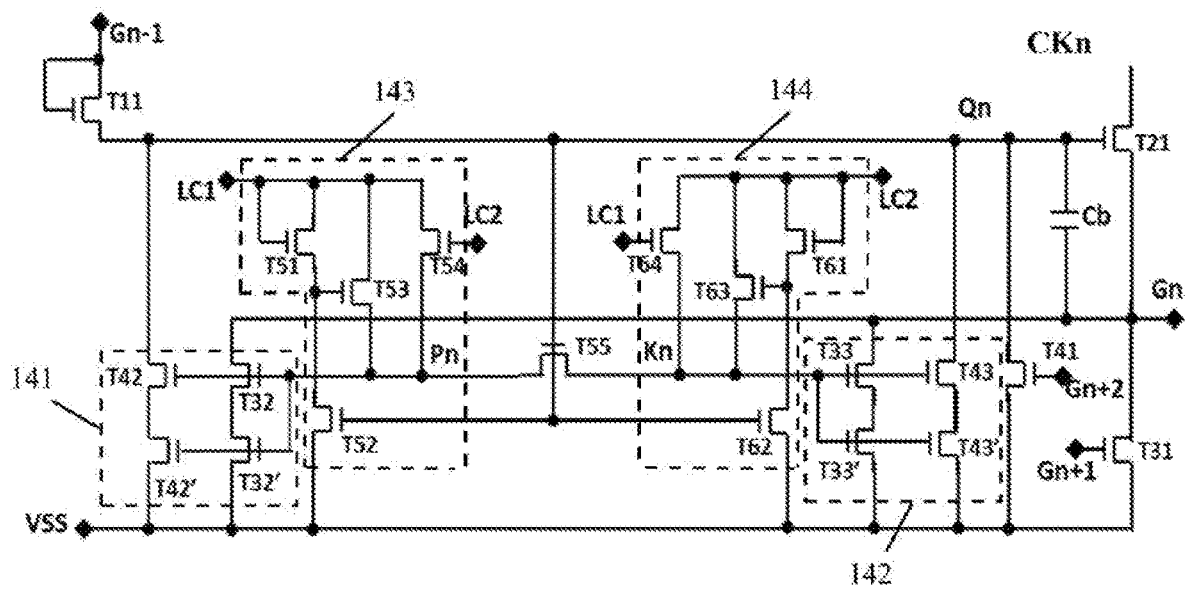
FIG. 2 is a structural diagram of the gate driving unit according to another embodiment of the present disclosure.

FIG. 2 is a structural diagram of the gate driving unit according to another embodiment of the present disclosure. An $N^{th}$-level gate driving unit controls the charging of an $N^{th}$ horizontal scanning line Gn in a display area.

Specifically, the pull-up control unit 110 is primarily used for controlling the switching-on time of the pull-up cascade transmission unit 120 to effect the scanning of the liquid crystal panel line by line. The pull-up control unit 110 can comprise a pull-up control transistor T11 having a gate and a drain coupled to each other for receiving the line scanning signal Gn−1 from a previous-level, i.e., an $(N-1)^{th}$-level, gate driving unit, generating and outputting the scanning control signal Qn when Gn−1 is at a high level.

The scanning control signal Qn is responsible for the proper operation timing of the whole gate driving unit. When line scanning proceeds to an $N^{th}$-level, Qn is at the high level and may be used to switch on the pull-up cascade transmission unit 120 to output the line scanning signal Gn. When the $N^{th}$-level is in a non-line scan state, it is necessary to make sure Qn is at a reliable low level, not allowing the pull-up cascade transmission unit 120 to output. Therefore, proper timing of the scanning control signal must be guaranteed in design of the gate driving unit and a driving circuit.

The pull-up cascade transmission unit 120 comprises a pull-up transistor T21 having a gate configured to receive the scanning control signal Qn generated by the pull-up control unit 110, a drain configured to receive the scanning clock signal CK, and a source used as a line scanning signal output terminal of the pull-up cascade transmission unit 120 and connected to the $N^{th}$ horizontal scanning line to generate and output the line scanning signal Gn.

The pull-up cascade transmission unit 120 further comprises a bootstrap capacitor Cb configured to save a voltage of a gate-source terminal of the pull-up transistor T21 when Qn is at the high level, and raise the a potential of the pull-up transistor T21 for a second time to ensure the pull-up transistor T21 is reliably switched on and outputs line scanning signals. Following the scanning timing of the present line, Gn outputs the low level and maintains it when other lines are being scanned.

The pull-down unit 130 is configured to pull down a source potential and a gate potential of the pull-up transistor T21 to the low level at the first time, i.e. to switch off the line scanning signal Gn. The pull-down unit 130 comprises a pull-down transistor T31 (a ninth pull-down transistor) and a pull-down transistor T41 (a tenth pull-down transistor), wherein T31 is configured to pull down the potential of the line scanning signal Gn, and its drain is connected to the line scanning signal Gn, i.e. to act on the $N^{th}$ horizontal scanning line. T41 is configured to pull down the scanning control signal Qn to switch off the pull-up transistor T21, and its drain is connected to the scanning control signal. Sources of T31 and T41 are jointly coupled to DC pull-down voltage VSS.

In general, gates of T31 and T41 are coupled together and connected to a horizontal scanning line Gn+1 of an $(N+1)^{th}$ line, that is, to receive the line scanning signal Gn+1 of the next-level gate driving unit, and the switching-off of the line scanning signal of the present line is controlled by an active line scanning signal in a next line, thereby effecting scanning line by line.

As also shown in FIG. 2, the gate of T31 is connected to the line scanning signal of a next-level gate driving unit, and the gate of T41 is connected to the line scanning signal of a further next-level gate driving unit. That is, by means of controlling T41 with Gn+2 and T31 with Gn+1, respectively, the time when Qn is at the high level is prolonged, and pulling down the potential of Gn with T21 and T31 simultaneously, Gn is pulled down to the negative potential faster, resulting an improved falling edge time of Gn.

When the next-level line scanning signal Gn+1 returns to the low level, the low level of Gn and Qn may not be maintained. Therefore, the pull-down maintaining unit 140 is used in the gate driving unit to maintain the low level of Gn and Qn.

In the present embodiment, the pull-down maintaining unit 140 is a circuit having mirrored structure. When the transistor is acted upon by DC signals for a long period, a DC stress may be produced. As a result, the performance of the transistor may be affected and the transistor failure may occur. When the two mirrored circuits work in turn, the impact of the DC stress resulting from the DC signals may be reduced.

Specifically, the mirrored circuit structures are connected by a source and a drain of a bridging transistor T55, i.e. a first pull-down maintaining unit 141 (a mirrored circuit proximate to one side of a transistor T52 in FIG. 2) and a second pull-down maintaining unit 142 (a mirrored circuit proximate to one side of a transistor T62 in FIG. 2), respectively. A source (or drain) of T55 is coupled to the first pull-down maintaining unit 141 at point Pn, and the drain (or source) of T55 is coupled to the second pull-down maintaining unit 142 at point Kn. A gate of T55 is connected to the scanning control signal Qn. In operation, left and the right mirrored circuit structures operate in turn, thereby reducing effectively the time when the transistor is affected by DC signals, and further reducing the impact of the DC stress, avoiding transistor failure resulting from DC stress, and improving the overall reliability of the gate driving unit (gate driving circuit).

Further, the first pull-down maintaining unit 141 comprises a first pull-down transistor T32 and a second pull-down transistor T32' for maintaining the line scanning signal Gn at the low level, as well as a third pull-down transistor T42 and a fourth pull-down transistor T42' for maintaining the scanning control signal Qn at the low level, respectively, wherein a drain of the first pull-down transistor T32 is connected to line scanning signal Chi and its source is concatenated with a drain of the second pull-down transistor T32', and a source of T32' is coupled to the DC pull-down voltage VSS. A drain of the third pull-down transistor T42 is connected to the scanning control signal Qn, and its source is concatenated with a drain of the fourth pull-down transistor T42', and a source of T42' is coupled to the DC pull-down voltage VSS. Gates of T32, T32', T42 and T42' are coupled jointly to the source or the drain of the bridging transistor T55.

Figure 3:
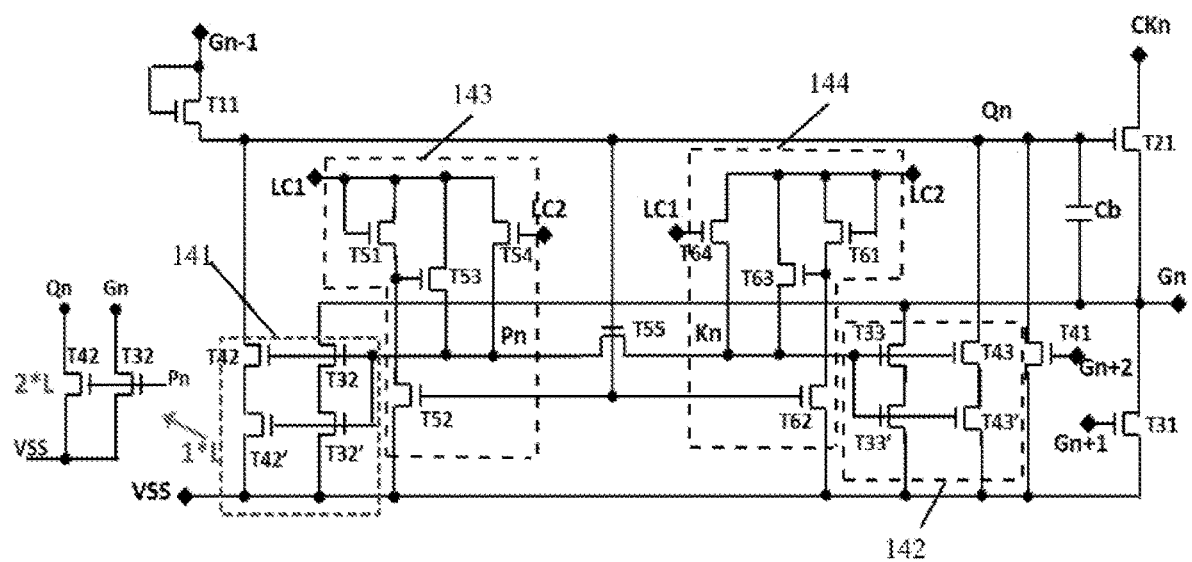
FIG. 3 is an equivalent circuit diagram of the gate driving unit according to another embodiment of the present disclosure.

An equivalent circuit of the concatenation of T32 and T32' and of the concatenation of T42 and T42' are shown in FIG. 3. T32 and T32' as well as T42 and T42' are respectively connected in the circuit in a concatenation, which means, the channel length of the present transistor increases, and the time of the high-temperature and high-humidity test for the gate driving circuit increases, resulting an improved circuit reliability. As shown in FIG. 3, if the channel lengths of transistors T32, T32', T42, and T42' are equal to L, the channel length will double and become 2L after the respective concatenations of T32 and T32' as well as of T42 and T42'.

In a manufacturing procedure of transistors with different channel lengths in the prior art, the problem of uneven films would emerge when photomasks having a same penetration is used for exposure, while the cost would rise when photomasks having different penetrations are used. In the embodiments of the present disclosure, channel lengths are increased through the concatenation of transistors, thus improving the reliability of the circuit without affecting the existing manufacturing technique.

The second pull-down maintaining unit 142 has such a circuit structure as to mirror the first pull-down maintaining unit 141.

The pull-down maintaining unit 140 further comprises a first alternate control unit 143 and a second alternate control unit 144 connected by the source and the drain of the bridging transistor T55 for coordinating alternate operation of the two Mirrored circuit structures. As shown in FIG. 2, the first alternate control unit 143 comprises a transistor T51

(a fifth transistor) having a gate and, a drain coupled together for receiving a first alternate control signal LC1, a transistor T53 (a sixth transistor) having a gate and a drain coupled to the source and the drain of the transistor T51 respectively, a transistor T54 (a seventh transistor) having a drain and a source coupled to the drain and the source of the transistor T53, respectively, and a gate configured to receive a second alternate control signal LC2, and a transistor T52 (an eighth transistor) having a drain coupled to the gate of the transistor T53, a gate coupled to the gate of the bridging transistor T55, and a source connected to the DC pull-down voltage VSS.

The second alternate control unit 144 has such a structure as to mirror the first alternate control unit 143, and detailed description thereof is omitted herein. The input terminals of the first alternate control signal and the second alternate control signal are interchanged, as shown in FIG. 2.

The first alternate control signal LC1 and the second alternate control signal LC2 are alternated between the high level and the low level for controlling the alternate operation of the mirrored circuit structures. The above operation procedure will be explained in connection with the operational timing diagram of FIG. 4.

Figure 4:
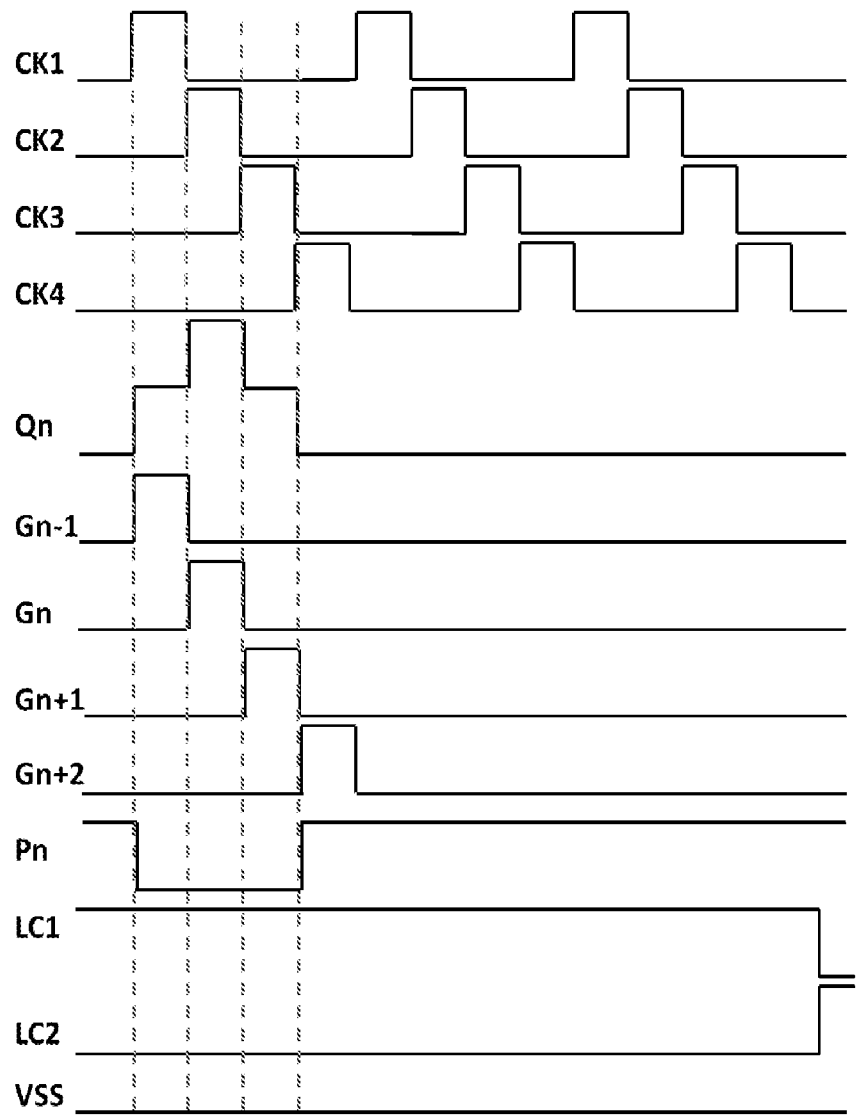
FIG. 4 is a signal waveform diagram of the gate driving unit during operation according to another embodiment of the present disclosure.

FIG. 4 shows waveform diagrams of the respective signals of the $N^{th}$-level gate driving unit. The driving circuit is driven by a plurality of scanning clock signals in combination, to mitigate the load and improve the driving capability when formed by cascading multilevel driving units. The embodiment in FIG. 4 will be described with example of four scanning clock signals CK1, CK2, CK3, and CK4. CK1, CK2, CK3, and CK4 have an equal frequency and drive four lines of pixel units sequentially. The timing in the figure can be taken as an example. One signal cycle of each of CK1, CK2, CK3, and CK4 contains ¼ cycle of high level and ¾ cycle of low level. During the driving, the scanning clock signal of a next-level gate driving unit is delayed by ¼ cycle than the scanning clock signal of its previous-level gate driving unit.

As shown in FIG. 2, the scanning clock signal of the $N^{th}$-level gate driving unit is CK2, and its previous-level, i.e., the $(N-1)^{th}$-level, gate driving unit is driven by the scanning clock signal CK1, an $(N+1)^{th}$-level driven by CK3, an $(N+2)^{th}$-level driven by CK4, and so forth. When CK1 is at the high level, Gn-1 outputs the high level of CK1 and simultaneously the pull-up control unit of the $N^{th}$-level gate driving unit is switched on as a result of the action of Gn-1. And the scanning control signal Qn reaches a first voltage value which can switch on the pull-up transistor T21.

During the next ¼ signal cycle, CK2 reaches to the high level and the output of the line scanning signal of the $N^{th}$-level driving unit is at the high level. The scanning control signal Qn is raised to a second voltage value as a result of the action of the bootstrap capacitor Cb. While pixels of the $N^{th}$ line are being scanned, the pull-up control transistor of the $(N+1)^{th}$-level driving unit receives the high level of Gn. When the line scanning signal Gn+1 of a next line reaches the high level, the transistor T31 is switched on, to pull down Gn to the low level, and reduce the potential of Qn to the first voltage value. Likewise, when the line scanning signal Gn+2 reaches the high level, Qn is pulled down to the low level. When Gn+1 and Gn+2 respectively return to the low level, Gn and Qn are maintained at the low level by the pull-down maintaining unit 140.

As shown in FIG. 2, when LC1 is at the high level and LC2 is at the low level, the first pull-down maintaining unit 141 and the first alternate control unit 143 are alternated in operation. When Qn is at the high level, T52 (T62) is switched on, wherein the voltage of the gate of T53 (the source of TM) is pulled down since T52 has been switched on, and T51 is switched on as a result of the action of LC1 at the high level. Meanwhile, T64 is switched on as a result of the actions of LC1 and LC2. After that, the potential of point K(N) is pulled down. So, point Pn is also pulled down to the low level when T55 is switched on.

When Qn reaches a low level, T52 and T55 are both switched off. The gate potential of T53 gradually rises till T53 is switched on as a result of the action of the LC1 signal, and then a high level signal is output by the source (that is, Pn) of T53. Hence, the transistors T32, T32', T42, and T42' are switched on simultaneously, and the scanning control signal Qn and the line scanning signal Gn are simultaneously pulled down and maintained at the low level.

Simultaneous switching-on of T32, T32', T42, and T42' means an increased channel length of individual transistors and enhanced reliability of the circuit.

It is also noteworthy that the frequencies of the first alternate control signal LC1 and the second alternate control signal LC2 are smaller than the frequency of the scanning clock signal CKn of the gate driving unit, and that LC1 and LC2 alternately shift between high and low potentials only when they are in the Blanking Time zone.

Figure 5:
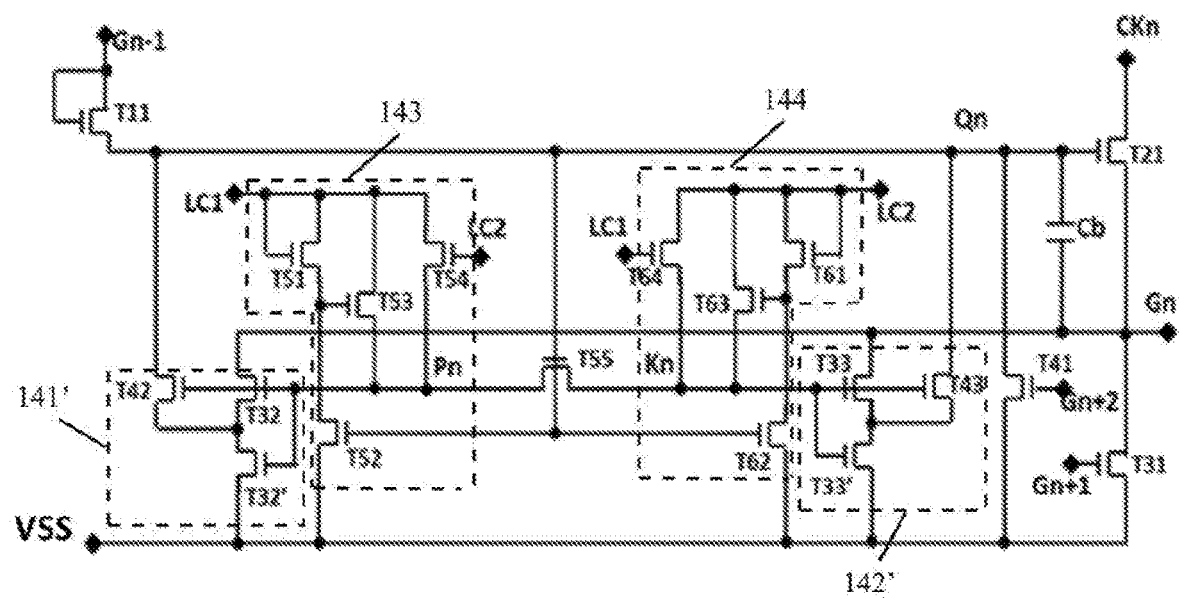
FIG. 5 is a structural diagram of the gate driving unit according to still another embodiment of the present disclosure.

FIG. 5 shows a structural diagram of the gate driving unit according to still another embodiment of the present disclosure. A shown in the figure, a main difference between the embodiment and the previous embodiment is that the first pull-down maintaining unit 141 comprises three pull-down transistors, i.e. the first pull-down transistor T32 and the second pull-down transistor T32' for maintaining the low level of the line scanning signal Gn, and the third pull-down transistor T42 for maintaining the low level of the scanning control signal Qn.

Therein, the drain of the first pull-down transistor T32 is connected to the line scanning signal Gn, and its source is concatenated with the drain of the second pull-down transistor T32'; and the source of T32' is coupled to the DC pull-down voltage VSS. The drain of the third pull-down transistor T42 is connected to the scanning control signal Qn, and its source is coupled to source-drain concatenation points of T32 and T32'. The gates of T32, T32', and T42 are coupled jointly to the source or drain of the bridging transistor T55.

The operation procedure of the first pull-down maintaining unit 141 comprises: the transistors T32, T32', and T42 are switched on simultaneously when Qn is at the low level; the concatenation structure of T32 and T32' means the increased channel length of the transistor for maintaining the low level of Gn; and the concatenation structure of T42 and T32' means the increased channel length of the transistor for maintaining the low level of Qn.

Compared to the previous embodiment, in the present embodiment, some layout design space is saved while the reliability of the driving circuit is improved due to the omission of the transistors T42' (and T43').

In the embodiments of the present disclosure, a design of a gate-cascade circuit for reducing electric leakage is provided to indirectly avoid electric leakage in the pull-down maintaining unit and increase the reliability of the gate driving circuit, by using mirrored pull-down maintaining circuit structures and two transistors in series connection to achieve the pull-down maintaining of the signal.

Although the embodiments of the present disclosure are disclosed as above, the description is only presented to provide an understanding of the present disclosure and does not constitute any limitations to the present disclosure.

Those skilled in the art can make any changes and modifications to the manner and details of implementation without departing from the spirit and scope of the present disclosure. But the scope of the present disclosure shall be subject to the scope defined in the claims.

The invention claimed is:

1. A gate driving unit, comprising:
a pull-up control unit configured to receive a line scanning signal of a previous-level gate driving unit and generate a scanning control signal for controlling operation of a pull-up cascade transmission unit;
the pull-up cascade transmission unit connected with the pull-up control unit and configured to convert a scanning clock signal into the line scanning signal in accordance with the received scanning control signal;
a pull-down unit connected with the pull-up control unit and the pull-up cascade transmission unit and configured to pull down the scanning control signal and the line scanning signal to a low level; and
a pull-down maintaining unit connected with the pull-up control unit and the pull-up cascade transmission unit and configured to maintain the scanning control signal and the line scanning signal at a low level during a line scanning period of pixel units that are not located in a current line;
wherein the pull-down maintaining unit comprises a first pull-down maintaining unit and a second pull-down maintaining unit that are connected to each other via a source and a drain of a bridging transistor, wherein the first pull-down maintaining unit comprises a first pull-down transistor, a second pull-down transistor, a third pull-down transistor, and a fourth pull-down transistor for maintaining low levels of the line scanning signal and the scanning control signal respectively,
wherein the first pull-down transistor has a drain connected with the line scanning signal and a source connected in series with a drain of the second pull-down transistor; the third pull-down transistor has a drain connected with the scanning control signal and a source connected in series with a drain of the fourth pull-down transistor; and sources of the second and fourth pull-down transistors are both coupled to a direct current (DC) pull-down voltage,
wherein gates of all the pull-down transistors are coupled jointly to a source or drain of the bridging transistor, and
wherein the second pull-down maintaining unit has such a circuit structure as to mirror the first pull-down maintaining unit.

2. The gate driving unit according to claim 1, wherein the pull-down maintaining unit further comprises a first alternate control unit and a second alternate control unit connected with the source and the drain of the bridging transistor,
wherein the first alternate control unit comprises:
a fifth transistor having a gate and a drain coupled to each other to receive a first alternate control signal;
a sixth transistor having a gate and a drain coupled to a source and the drain of the fifth transistor, respectively;
a seventh transistor having a drain and a source coupled to the drain and a source of the sixth transistor respectively, and a gate configured to receive a second alternate control signal; and an eighth transistor having a drain coupled to the gate of the sixth transistor, a gate coupled to the gate of the bridging transistor, and a source connected to the DC pull-down voltage; and
wherein the second alternate control unit has such a circuit structure as to mirror the first alternate control unit, and input ends of a first alternate control signal and a second alternate control signal thereof are interchanged,
wherein the first alternate control signal and the second alternate control signal are alternately in a high level and the low level.

3. The gate driving unit according to claim 2, wherein the alternate control signal has a frequency smaller than that of the scanning clock signal of the gate driving unit.

4. The gate driving unit according to claim 3, wherein the pull-down unit comprises a ninth pull-down transistor and a tenth pull-down transistor,
wherein the ninth transistor and the tenth transistor have respective drains connected with the line scanning signal and the scanning control signal, sources connected with the DC pull-down voltage, and gates connected jointly with the line scanning signal of a next level gate driving unit.

5. The gate driving unit according to claim 4, wherein the gate of the ninth pull-down transistor is connected to the line scanning signal of the next-level gate driving unit, and the gate of the tenth pull-down transistor is connected to the line scanning signal of a further next-level gate driving unit.

6. The gate driving unit according to claim 5, wherein the pull-up cascade transmission unit comprises:
a pull-up transistor having a gate connected with the scanning control signal, a drain connected with the scanning clock signal, and a source which generates and outputs the line scanning signal; and
a bootstrap capacitor having two ends connected in parallel with the gate and the source of the pull-up transistor to boost the scanning control signal when outputting the line scanning signal to ensure reliable output of the pull-up transistor.

7. The gate driving unit according to claim 6, wherein the pull-up control unit comprises a pull-up control transistor, and the gate and the drain of the pull-up transistor are coupled together to receive the line scanning signal of the previous-level gate driving unit and generate and output the scanning control signal when the line scanning signal is at the high level.

8. A gate driving circuit comprises a cascade of gate driving units, the gate driving unit comprising:
a pull-up control unit configured to receive a line scanning signal of a previous-level gate driving unit and generate a scanning control signal for controlling operation of a pull-up cascade transmission unit;
the pull-up cascade transmission unit connected with the pull-up control unit and configured to convert a scanning clock signal into the line scanning signal in accordance with the received scanning control signal;
a pull-down unit connected with the pull-up control unit and the pull-up cascade transmission unit and configured to pull down the scanning control signal and the line scanning signal to a low level; and
a pull-down maintaining unit connected with the pull-up control unit and the pull-up cascade transmission unit and configured to maintain the scanning control signal and the line scanning signal at a low level during a line scanning period of pixel units that are not located in a current line, wherein the gate driving circuit drives respective gate driving units in succession by using four scanning clock signals of equal frequencies, each of the scanning clock signals containing ¼ cycle of high level and ¾ cycle of low level, and the scanning clock signal of a next-level gate driving unit being delayed by ¼ cycle as compared with the scanning clock signal of a previous-level gate driving unit;

wherein the pull-down maintaining unit comprises a first pull-down maintaining unit and a second pull-down maintaining unit that are connected to each other via a source and a drain of a bridging transistor, wherein the first pull-down maintaining unit comprises a first pull-down transistor, a second pull-down transistor, a third pull-down transistor, and a fourth pull-down transistor for maintaining low levels of the line scanning signal and the scanning control signal respectively, wherein the first pull-down transistor has a drain connected with the line scanning signal and a source connected in series with a drain of the second pull-down transistor; the third pull-down transistor has a drain connected with the scanning control signal and a source connected in series with a drain of the fourth pull-down transistor; and sources of the second and fourth pull-down transistors are both coupled to a direct current (DC) pull-down voltage, wherein gates of all the pull-down transistors are coupled jointly to a source or drain of the bridging transistor, and wherein the second pull-down maintaining unit has such a circuit structure as to mirror the first pull-down maintaining unit.

9. A gate driving unit, comprising:

a pull-up control unit configured to receive a line scanning signal of a previous-level gate driving unit and generate a scanning control signal for controlling operation of a pull-up cascade transmission unit;

the pull-up cascade transmission unit connected with the pull-up control unit and configured to convert a scanning clock signal into the line scanning signal in accordance with the received scanning control signal;

a pull-down unit connected with the pull-up control unit and the pull-up cascade transmission unit and configured to pull down the scanning control signal and the line scanning signal to a low level; and a pull-down maintaining unit connected with the pull-up control unit and the pull-up cascade transmission unit and configured to maintain the scanning control signal and the line scanning signal at a low level during a line scanning period of pixel units that are not located in a current line:

wherein the pull-down maintaining unit comprises a first pull-down maintaining unit and a second pull-down maintaining unit connected to each other via a source and a drain of a bridging transistor, wherein the first pull-down maintaining unit comprises a first pull-down transistor, a second pull-down transistor, and a third pull-down transistor for maintaining the low levels of the line scanning signal and the scanning control signal, respectively, wherein the first pull-down transistor has a drain connected with the line scanning signal, and a source connected in series to a drain of the second pull-down transistor, and the third pull-down transistor has a drain connected with the scanning control signal, and a source coupled to a source-drain concatenation point of the first pull-down transistor and the second pull-down transistor, wherein gates of the all pull-down transistors are coupled together to the source or the drain of the bridging transistor, and wherein and the second pull-down maintaining unit has such a circuit structure as to mirror the first pull-down maintaining unit.

10. The gate driving unit according to claim 9, wherein the pull-down maintaining unit further comprises a first alternate control unit and a second alternate control unit connected by the source and the drain of the bridging transistor, wherein the first alternate control unit comprises:

a fifth transistor having a gate and a drain coupled to each other to receive a first alternate control signal; a sixth transistor having a gate and a drain coupled to a source and drain of the fifth transistor, respectively;

a seventh transistor having a drain and a source coupled to the drain and a source of the sixth transistor respectively, and a gate configured to receive a second alternate control signal; and an eighth transistor having a drain coupled to the gate of the sixth transistor, a gate coupled to the gate of the bridging transistor, and a source connected to a DC pull-down voltage; and wherein the second alternate control unit has, such a circuit structure as to mirror the first alternate control unit, and input ends of a first alternate control signal and a second alternate control signal thereof are interchanged, wherein the first alternate control signal and the second alternate control signal are alternately in a high level and the low level.

* * * * *